United States Patent [19]

Pasch et al.

[11] Patent Number: 6,059,637
[45] Date of Patent: May 9, 2000

[54] PROCESS FOR ABRASIVE REMOVAL OF COPPER FROM THE BACK SURFACE OF A SILICON SUBSTRATE

[75] Inventors: Nicholas F. Pasch, Pacifica; Joe W. Zhao, San Jose, both of Calif.

[73] Assignee: LSI Logic Corporation, Milpitas, Calif.

[21] Appl. No.: 08/990,315

[22] Filed: Dec. 15, 1997

[51] Int. Cl.$^7$ ........................................... B24B 1/00
[52] U.S. Cl. ........................ 451/41; 451/28; 451/57; 438/691
[58] Field of Search ........................... 457/41, 285–289, 457/28, 57; 438/691, 692

[56] References Cited

U.S. PATENT DOCUMENTS

| | | | |
|---|---|---|---|
| 4,410,395 | 10/1983 | Weaver et al. | 156/662 |
| 5,122,481 | 6/1992 | Nishiguchi | 437/225 |
| 5,700,348 | 12/1997 | Sakurai | 156/636.1 |
| 5,817,572 | 10/1998 | Chiang et al. | 438/624 |

*Primary Examiner*—Robert A. Rose
*Assistant Examiner*—George Nguyen
*Attorney, Agent, or Firm*—John P. Taylor

[57] ABSTRACT

Described is an improvement in a process wherein integrated circuit structures are formed on a front surface of a silicon substrate and at least one layer of copper is deposited on the front surface of the substrate to form a layer of copper interconnects, and wherein at least some copper is also deposited on the back surface of the substrate during this deposition. The improvement comprises: prior to the end of the formation of the integrated circuit structures, abrasively removing, from the backside of the substrate, copper deposited thereon during the deposition of copper on the front surface. The step of abrasively removing copper from the back side of the substrate is preferably carried out before exposure of the substrate and the copper thereon, including copper deposited on the back side of the substrate, to any subsequent high temperature processing, and preferably, the step of abrasively removing the copper from the backside of the substrate comprises a chemical/mechanical polishing step which leaves a polished surface on the backside of the substrate to facilitate subsequent mounting or packaging of the integrated circuit structures.

20 Claims, 4 Drawing Sheets

FORMING A LAYER OF COPPER INTERCONNECTS ON THE FRONT SURFACE OF A SILICON SUBSTRATE AS A PART OF AN INTEGRATED CIRCUIT STRUCTURE

THEREAFTER CHEMICALLY/MECHANICALLY POLISHING THE BACK SURFACE OF THE SUBSTRATE, PRIOR TO FURTHER HIGH TEMPERATURE PROCESSING OF THE SUBSTRATE, TO REMOVE COPPER DEPOSITED THEREON DURING THE STEP OF FORMING THE LAYER OF COPPER INTERCONNECTS

REPEATING THE CHEMICAL/MECHANICAL POLISHING STEP ON THE BACK SURFACE OF THE SUBSTRATE AFTER EACH FORMATION OF A LAYER OF COPPER INTERCONNECTS ON THE FRONT SURFACE OF THE SUBSTRATE

FIG. 6

PROCESS FOR ABRASIVE REMOVAL OF COPPER FROM THE BACK SURFACE OF A SILICON SUBSTRATE

BACKGROUND OF THE INVENTION

1. Field of the Invention

This invention relates to a process for forming an integrated circuit structure with at least one layer of copper interconnects on a silicon substrate. More particularly, this invention relates to a process for the abrasive removal of copper deposited on the back surface of the substrate, prior to further high temperature processing of the substrate.

2. Description of the Related Art

In the formation of integrated circuit structures of ever decreasing size, and increasing speed or response, with adequate current carrying capabilities, the use of copper as a replacement interconnect material for aluminum has become of interest because of the lower resistance of copper and resulting ability to carry higher current.

However, the replacement of aluminum interconnects or wiring with copper requires changes in processing. An aluminum layer may be patterned to form interconnects by a plasma etch which, for example, may form a volatile aluminum chloride compound which may then be removed as a gas from the etch chamber. However, the difficulty in forming volatile copper compounds has resulted in the need to use other methods of patterning a layer of copper interconnects.

One process for forming copper interconnects which has been proposed, is to form a pattern of trenches in an insulation layer conforming to the desired pattern of copper interconnects. A blanket deposition of copper is then made over the insulation layer and in the trenches. A subsequent chemical/mechanical polishing step then removes the copper from the surface of the insulation layer, leaving the desired pattern of copper interconnects in the trenches.

While the sputtering or physical vapor deposition (PVD) of copper would be the deposition process of choice for filling the trenches with copper, due to ease of spatial control of the deposited area, sputtering does not adequately fill narrow trenches (e.g., trenches having a width less than 0.75 microns). Therefore, to provide for adequate filling of the trenches, it has been proposed to either deposit the copper by chemical vapor deposition (CVD) or by electroplating.

However, both of these latter deposition processes can result in undesirable deposition of copper on the back surface of the substrate, as well as on the desired areas on the front side of the substrate, e.g., in the trenches in the insulation layer. Since copper rapidly diffuses through silicon at high temperatures, such as those temperatures incurred during subsequent processing of the structure (e.g., during annealing or deposition of a further insulation layer), it is imperative that copper not be permitted to accumulate on the back surface of the substrate, since the presence of copper in the silicon substrate can degrade the performance of integrated circuit devices formed in such a copper-containing silicon substrate.

However, a silicon substrate is normally provided with a roughened surface on the back side of the substrate which prevents easy removal of accumulated copper thereon. Such a roughened back surface is normally provided to facilitate differentiation between the front and back sides of the substrate during processing. The roughened back surface of the substrate also serves to create strain fields in the back surface of the substrate which act as a gettering surface for minor metal impurities in the silicon substrate, such as Cr, Ni, Fe, Ca, and Cu. Such minor impurities diffuse to the surface of the silicon substrate during high temperature processing of the substrate to form the integrated circuit devices therein. While such strain fields might be expected to mitigate undesired diffusion of copper into and through the silicon substrate (by tying up the copper atoms), it is believed that the amount of copper which may be expected to accumulate on the back surface of the substrate during a CVD or electroplating copper deposition process may be in excess of the amount of copper which may be effectively gettered by the roughened back surface of the substrate.

It is conventional to mechanically grind the backside of a silicon substrate after all processing of the front side of the substrate is completed, both to thin the substrate thickness, as well as to ensure uniformity of substrate thickness which facilitates subsequent packaging. While such grinding would remove any copper deposited on the back surface of the substrate, by the time this grinding step is carried out—at the end of all processing, copper already deposited on the back surface of the substrate during earlier metal interconnects forming steps, may have already had an opportunity to diffuse into the substrate during heating steps performed on the substrate subsequent to the copper deposition and prior to this wafer thinning step.

SUMMARY OF THE INVENTION

In accordance with the invention, in a process wherein integrated circuit structures are formed on a front surface of a silicon substrate and copper is deposited on the front surface of the substrate to form at least one layer of copper interconnects layer, and wherein at least some copper is also deposited on the back surface of the substrate during this deposition, the improvement which comprises: prior to the end of the formation of the integrated circuit structures, abrasively removing, from the back surface of the substrate, copper deposited thereon during the deposition of copper on the front surface of the substrate.

Preferably, the step of abrasively removing the copper from the back surface of the substrate is carried out before exposure of the substrate and the copper thereon, including copper deposited on the back surface of the substrate, to any subsequent high temperature processing, and preferably the step of abrasively removing the copper from the back surface of the substrate comprises a chemical/mechanical polishing step which leaves a polished surface on the backside of the substrate.

BRIEF DESCRIPTION OF THE DRAWINGS

FIG. 6 is a flow sheet describing the preferred embodiment of the process of the invention.

DETAILED DESCRIPTION OF THE INVENTION

The invention comprises an improvement in a process wherein integrated circuit structures are formed on a front surface of a silicon substrate and at least one layer of copper is deposited on the front surface of the substrate to form a layer of copper interconnects, and wherein at least some copper is also deposited on the back surface of the substrate during this deposition. The improvement comprises: prior to the end of the formation of the integrated circuit structures, abrasively removing, from the back surface of the substrate, copper deposited thereon during the deposition of copper on the front surface of the substrate.

Preferably, the step of abrasively removing copper from the back side of the substrate is carried out before exposure of the substrate and the copper thereon, including the copper deposited on the back surface of the substrate, to any subsequent high temperature processing; and preferably the step of abrasively removing the copper from the back surface of the substrate comprises a chemical/mechanical polishing step which leaves a polished surface on the backside of the substrate which may facilitate subsequent processing of the integrated circuit structures.

Figure 1:
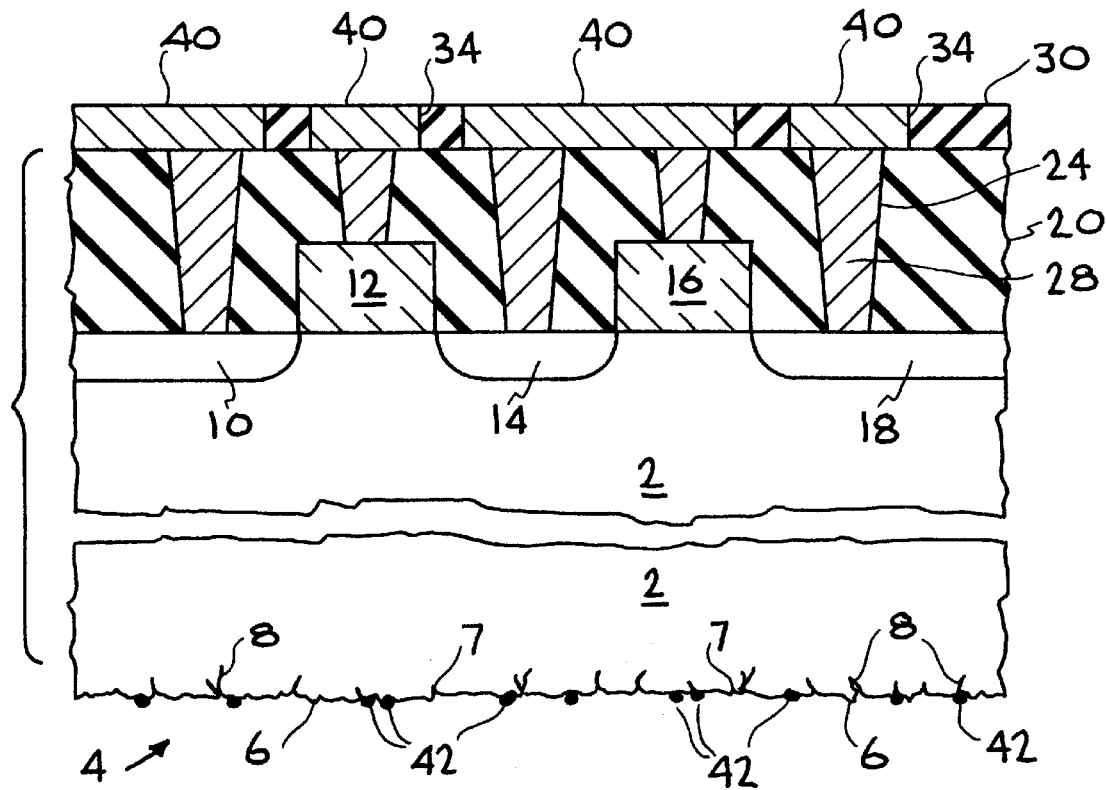
FIG. 1 is a fragmentary vertical cross-sectional view of a silicon substrate showing a typical integrated circuit structure formed on the front surface thereof, including a layer of copper interconnects, and showing the deposition of copper on the roughened back surface of the substrate.
Figure 1A:
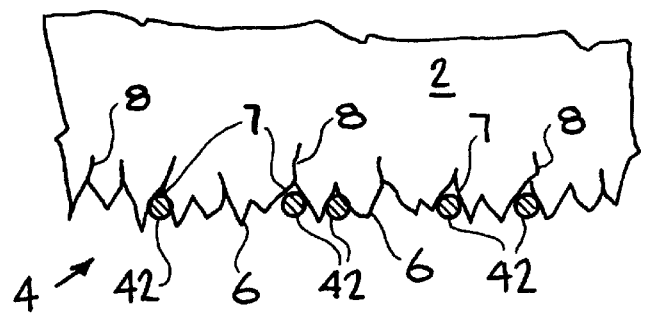
FIG. 1A is an enlarged view of a portion of FIG. 1, showing the roughened back surface and cracks in the substrate and showing the deposition of copper on this roughened back surface.
Figure 2:
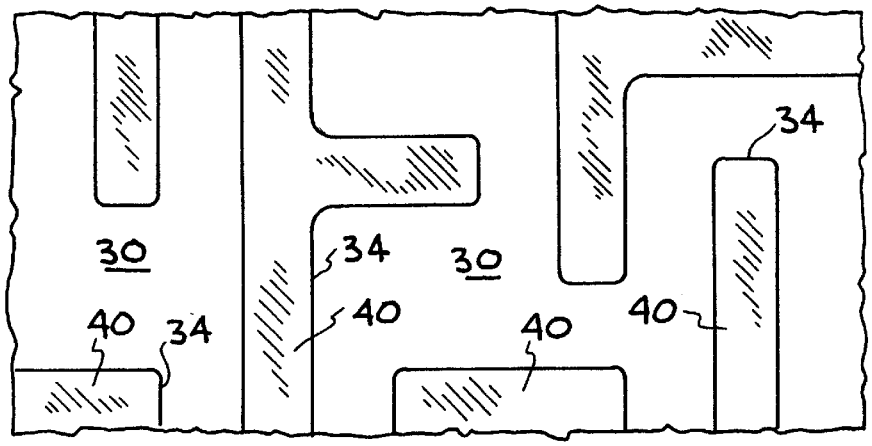
FIG. 2 is a fragmentary top view of the structure of FIG. 1, showing the pattern of copper interconnects formed in trenches etched in an insulation layer.

Turning now to FIGS. 1, 1A, and 2, a silicon substrate 2 is shown having a portion of an integrated circuit structure formed on the front surface thereon. The fragmentary integrated circuit structure depicted (which is only by way of illustration) includes several MOS transistors comprising first source/drain region 10, first gate electrode 12, second source/drain region 14, second gate electrode 16, and third source/drain region 18. A first insulation layer 20 is shown formed over the structure and contact openings 24 are shown formed through insulation layer to the underlying source/drain regions and gate electrodes. These contact openings are filled with one or more conductive materials 28, to provide electrical contact to the copper interconnect layer to be formed thereon as well as to provide a chemical barrier between the copper interconnect layer and the underlying silicon.

In the illustrated structure, a second insulation layer 30 is shown formed over first insulation layer 20, and a pattern of trenches 34 has been etched in and through insulation layer 30 in registry and communication with underlying filled contact openings 24. A layer of copper has been previously blanket deposited over second insulation layer 30 and then chemically/mechanically polished back, leaving copper interconnects 40 in trenches 34, as best seen in FIG. 2.

As shown in FIGS. 1 and 1A, during the step of blanket deposition of copper on the front surface of the substrate and integrated circuit structure thereon to form copper interconnects 40, some copper, indicated in exaggerated form at numeral 42, inadvertently deposits on back surface 4 of substrate 2. As also shown in exaggerated form, back surface 4 of substrate 2 is a roughened surface containing high portions 6 and low portions 7, as well as surface cracks 8, all of which serve to create strain fields which attract copper portions 42.

Figure 3:
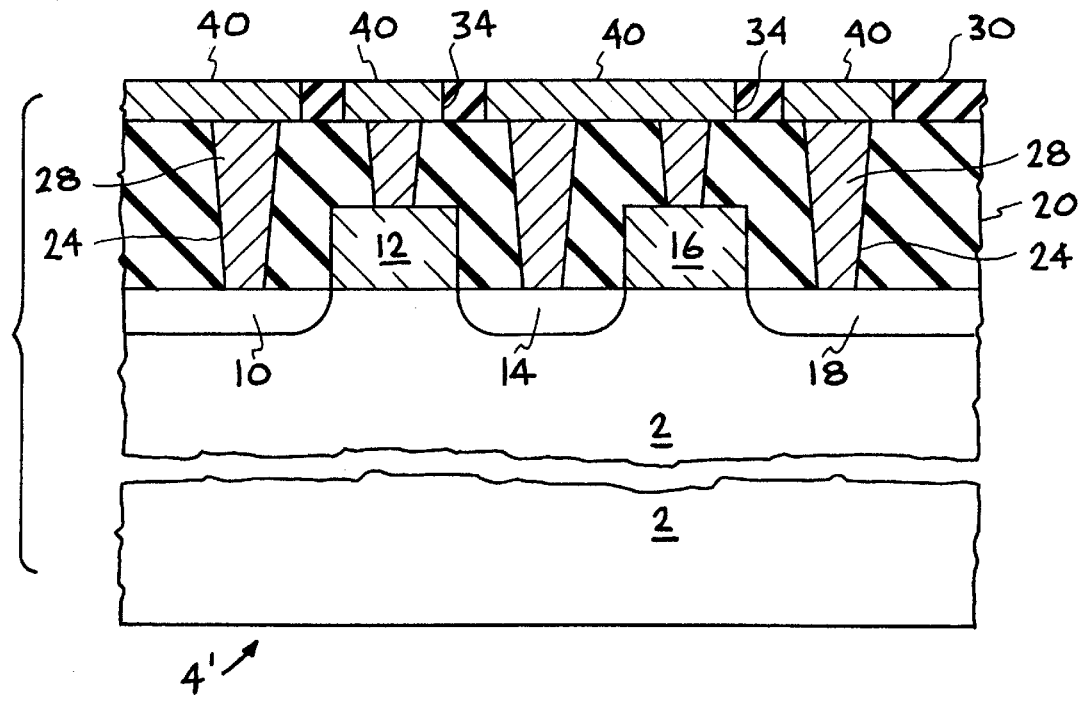
FIG. 3 is a fragmentary vertical cross-sectional view of the structure of FIG. 2 after a chemical/mechanical polishing step has been carried out to remove the roughened back surface of the silicon substrate and any copper deposited thereon.

Turning now to FIG. 3, in accordance with a preferred embodiment of the invention, back surface 4 of substrate 2 has been subject to a chemical/mechanical polishing (CMP) step to remove copper 42, resulting in the formation of smooth or polished surface 4' on the back side of substrate 2. It will be noted that a sufficient amount of roughened surface 4 has been removed so that high portions 6, low portions 7, and surface cracks 8 are all removed as well as copper 42. In particular, such removal of cracks 8 serves to reduce subsequent penetration of copper into the substrate during subsequent copper depositions. The removal of roughened surface 4 provides an additional advantages in that any and all of the previously discussed metal impurities which have previously migrated to roughened surface 4, and been bound or gettered thereto, have been removed with copper 42, cracks 8, and roughened portions 6 and 7 of back surface 4 during the CMP step.

It should be noted that it is preferred that any copper deposited on back surface 4 of substrate 2 during any copper deposition step be immediately removed thereafter, i.e., prior to any further high temperature processes which would permit the copper atoms to diffuse into the unprotected rear surface 4 of substrate 2. Such subsequent high temperature processing, for example, would include annealing of interfaces in an inert or reducing gas at ~425° C. to form low resistance contacts, and forming of further oxide layers at deposition temperatures of 250–400° C. The use herein of the term "high temperature processing", with regard to processing of the substrate after the formation of the first layer of copper interconnects thereon, is, therefore, intended to mean any subsequent processing of the substrate at a temperature of at least about 200° C.

However, it may be possible, in some instances, to postpone the copper removal step until after formation of a second or third layer of copper interconnects, particularly if the amount of copper deposited on the rear surface of the substrate during each preceding formation of an interconnect layer does not reach an amount which, if exposed to high temperature processing and allowed to diffuse into the substrate, would damage performance of the integrated circuit devices being formed therein. It should be noted, in this regard, that the diffusion rate (for a single high temperature anneal) is not high relative to the amount of copper which deposits on the rear surface of the substrate. Therefore, even postponing the copper removal step until after the first or second high temperature anneal will still be effective in removing the copper and therefore prevent further diffusion during subsequent high temperature processing. It will, however, be appreciated that the copper concentration is cumulative, so at some point, it will be necessary to conduct the process of the invention. In any event, the copper is preferably removed from the back side of the substrate after each copper deposition.

It should also be noted that it is within the contemplation of the invention that a mechanical grinding operation could be performed on substrate 2 at this point in the process instead of the chemical/mechanical polishing step. Therefore, the terms "abrasive" and "abrasively", as used herein will be understood to refer to either grinding or chemical/mechanical polishing of the substrate to remove copper from the back surface of the substrate. Such a grinding step would remove any copper deposited on the back surface of the substrate, but would leave a new roughened surface which could still act as a getter for any further impurities migrating from the other points in the substrate. However, since such a grinding at this point in the process is more likely to result in damage or weakening (due to thinning) of the substrate than would a CMP process, the CMP process is preferred.

Figure 4:
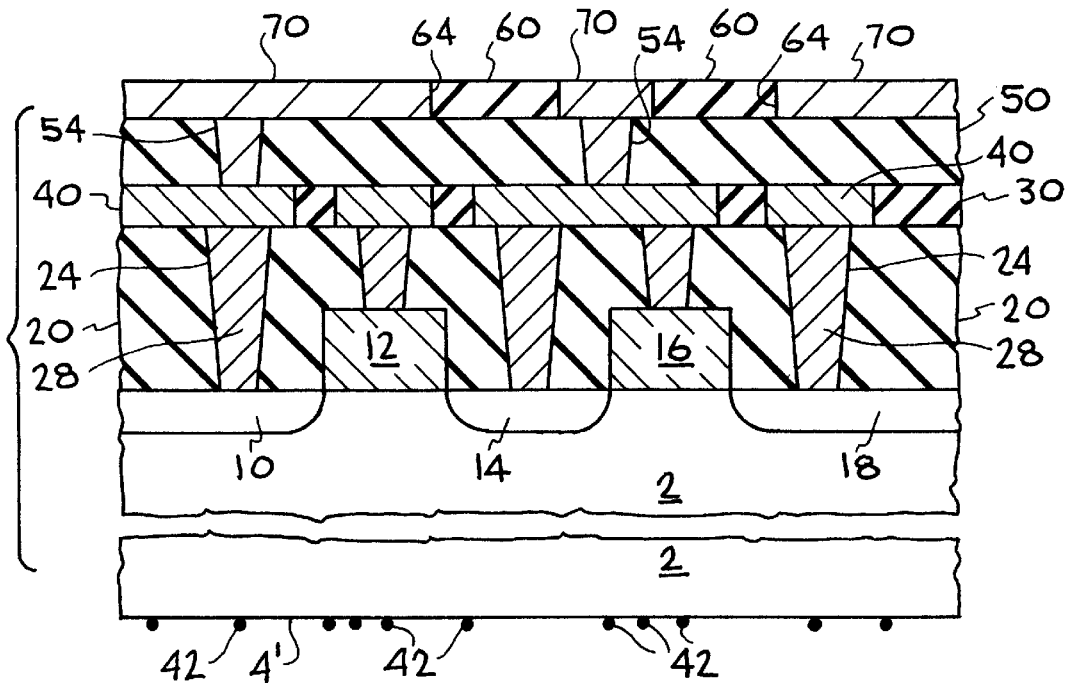
FIG. 4 is a fragmentary vertical cross-sectional view of the structure of FIG. 3 after a formation of a second layer of copper interconnects on the front surface of the silicon substrate and the deposition of further copper on the now-polished back surface of the substrate from this second copper deposition.

Turning now to FIG. 4, the structure of FIG. 3 is shown after formation of a second layer of copper interconnects 70 thereon. Second copper interconnects 70 are formed similarly to first copper interconnects 40 by deposition of third insulation layer 50 over second insulation layer 30 and first copper interconnects 40, formation of filled vias 54 through third insulation layer 50 to first copper interconnects 40, deposition of a fourth insulation layer 60, formation of a pattern of trenches 64 in the surface of fourth insulation layer 60 in registry with vias 54, blanket deposition of a second copper layer, and polishing back of the second copper layer to remove portions of the copper layer on the surface of fourth insulation layer 60, leaving second copper interconnects 70.

It will, however, be noted that this formation of second layer of copper interconnects 70 has again resulted in the deposition of copper 42 on the back side of wafer 2, this time, however, on polished rear surface 4', rather than on original roughened rear surface 4 which has now been removed by the previous CMP step. While it may be noted that less copper seems to have deposited on polished rear surface 4' (which could be due to the absence of strain fields attracting the copper atoms) it is still very important that such deposited copper atoms be removed, and preferably removed prior to any further high temperature processing. In fact, it may be found to be more important to remove the copper deposited over polished rear surface 4' than the previous removal of deposited copper on roughened surface 4, because the absence of strain fields on polished rear surface 4' of substrate 2 may actually enhance the undesirable penetration and diffusion of the copper atoms into and through silicon substrate 2. That is the presence of the strain fields in roughened rear surface 4 of silicon substrate 2 serve to restrain or inhibit penetration of the copper into the silicon substrate, and polishing of roughened surface 4 removes such restraints, leaving substrate 2 more vulnerable to penetration and diffusion of copper therein.

Figure 5:
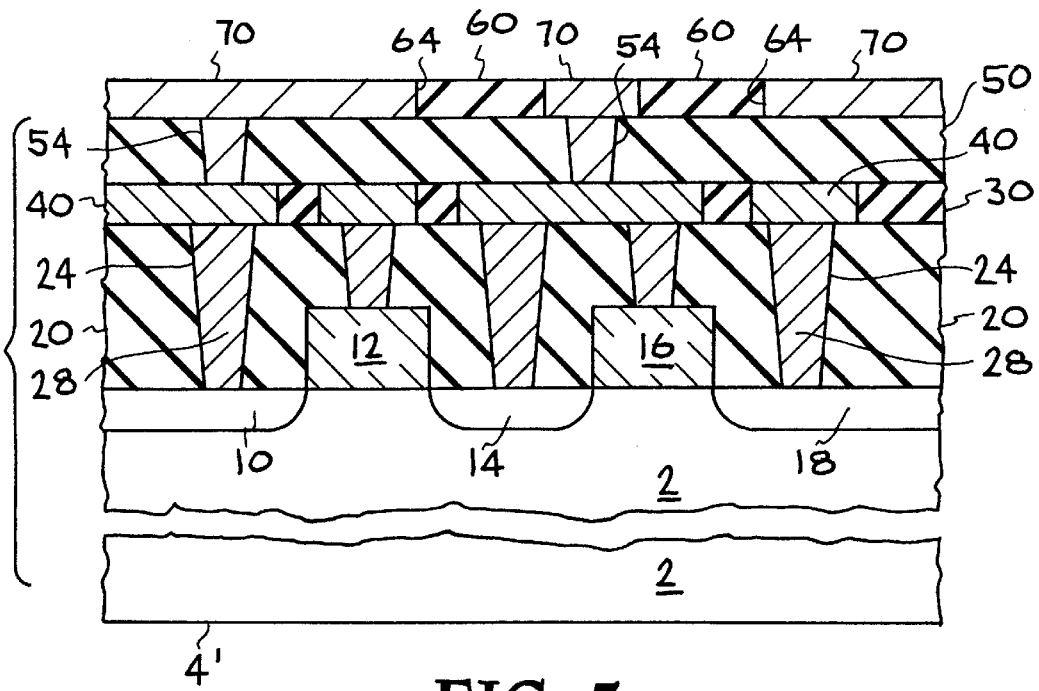
FIG. 5 is a fragmentary vertical cross-sectional view of the structure of FIG. 4 after a subsequent chemical/mechanical polishing step to remove the copper deposited over the previously polished back surface of the silicon substrate.

Therefore, in accordance with the invention, as illustrated in FIG. 5, polished rear surface 4' of substrate 2 is subject to a further CMP step to remove any copper deposited on rear surface 4' of substrate 2 during formation of second copper interconnects 70, resulting in the structure shown in FIG. 5.

It will be appreciated that if more than two layers of copper interconnects are formed on substrate 2, the copper removal process may be again repeated, preferably after formation of each layer of copper interconnects, although, as mentioned above, it may be possible to omit one or more of the copper removal steps in formations of multiple layers of copper interconnects if the copper accumulation on the back side of the substrate after each copper deposition is sufficiently small.

The process for removal of copper from the back surface of the silicon substrate, using chemical/mechanical polishing (CMP), may be carried out under standard CMP parameters normally used in conventional CMP processing of the front side of the wafer. For example, the same parameters may be used which are used in the conventional polishing of silicon oxide using commercially available CMP polishing fluids such as, for example, Cabosil, a suspension of finely divided silica (~500 Angstroms) in a basic solution, which is commercially available from Cabot Industries. The chemical/mechanical polishing process is usually carried out for a period of from about 1 to about 4 minutes, preferably about 1 to about 3 minutes, and most preferably about 2 minutes. Typically, the removal of from about 1 to about 3 microns of silicon, and typically about 2 microns of silicon, will be sufficient to also remove all copper deposited on the roughened rear surface of the substrate. The need for longer or shorter polishing periods, to remove more or less silicon, may be empirically determined based on the amount of copper being deposited on the back side of the substrate in the particular deposition apparatus and process being utilized to deposit the copper, as long as the polishing process is carried out for a sufficient time to remove all of the copper.

During the abrasive step (polishing or grinding) used to remove the copper from the back side of the substrate, it may be necessary to protect the front surface of the substrate on which at least a portion of the integrated circuit structure has been already formed. Such protection may be provided to the front surface of the structure by coating it with an easily strippable coating such as, for example, a strippable organic coating material such as a novalak, urethane, or polyimide. Preferably, however, such a protective coating is either water soluble or soluble in a solvent which is non-reactive with the exposed copper on the front surface of the structure.

Thus, the invention provides an improvement in the process for forming copper interconnects for integrated circuit structures wherein copper, inadvertently deposited on the back surface of a silicon substrate during formation of such copper interconnects on the front surface of the substrate, is abrasively removed from the back surface of the substrate, preferably using a chemical/mechanical polishing process, to prevent such copper from diffusing into the substrate where it could degrade the performance of the integrated circuit devices formed in the substrate.

Having thus described the invention what is claimed is:

1. In a process for forming an integrated circuit structure on a front surface of a silicon substrate wherein copper is deposited on said front surface of said substrate to form a layer of copper interconnects, and wherein at least some copper is also deposited on the back surface of the substrate during this deposition, the improvement which comprises:

abrasively removing, from the back surface of said substrate, copper deposited thereon during said copper deposition on said front surface of said substrate, to prevent said copper deposited on said back surface of said substrate from diffusing into said silicon substrate.

2. The process of claim 1 wherein said back surface of said silicon substrate is roughened and said copper is removed from said back surface of said substrate by removing at least a portion of said roughened back surface of the silicon substrate on which the copper has deposited.

3. The process of claim 1 wherein said abrasive removal of said copper from said back surface of said substrate further comprises carrying out said removal step prior to any further high temperature processing of said substrate.

4. The process of claim 3 wherein said abrasive removal of said copper from said back surface of said substrate further comprises mechanically grinding said back surface of said substrate to remove any copper deposited thereon during said step of forming said layer of copper interconnects on said front surface of said substrate.

5. The process of claim 3 wherein said abrasive removal of said copper from said back surface of said substrate further comprises chemically/mechanically polishing said back surface of said substrate to remove any copper deposited thereon during said step of forming said layer of copper interconnects on said front surface of said substrate.

6. The process of claim 5 which further comprises repeating said chemical/mechanical polishing step to remove copper from said back surface of said substrate after each subsequent layer of copper interconnects is formed on said front surface of said silicon substrate.

7. In a process for forming an integrated circuit structure on a front surface of a silicon substrate wherein copper is deposited on said front surface of said substrate to form a layer of copper interconnects, and wherein at least some copper is also deposited on the back surface of the substrate during this deposition, the improvement which comprises:

chemically/mechanically polishing the roughened back surface of said substrate to remove copper deposited thereon during said copper deposition on said front surface of said substrate, to prevent said copper deposited on said back surface of said substrate from diffusing into said silicon substrate.

8. The process of claim 7 wherein said copper is removed from said back surface of said substrate by removing at least a portion of said roughened back surface of the silicon substrate on which the copper has deposited.

9. The process of claim 7 wherein said chemical/mechanical processing is carried out for a period of time ranging from about 1 to about 4 minutes.

10. The process of claim 7 wherein said chemical/mechanical processing is carried out for a period of time sufficient to remove from about 1 to about 2 microns of silicon from said back surface of said substrate.

11. The process of claim 7 wherein said chemical/mechanical processing is carried out for a period of time sufficient to remove at least about 2 microns of silicon from said back surface of said substrate.

12. The process of claim 7 wherein said abrasive removal of said copper from said back surface of said substrate further comprises carrying out said removal step prior to any further high temperature processing of said substrate.

13. The process of claim 12 which further comprises repeating said chemical/mechanical polishing step to remove copper from said back surface of said substrate after each subsequent layer of copper interconnects is formed on said front surface of said silicon substrate.

14. In a process for forming an integrated circuit structure on a front surface of a silicon substrate wherein copper is deposited on said front surface of said substrate to form a layer of copper interconnects, and wherein at least some copper is also deposited on the back surface of the substrate during this deposition, the improvement which comprises:

chemically/mechanically polishing the roughened back surface of said substrate, prior to any further high temperature processing of said substrate, to remove copper deposited thereon during said copper deposition on said front surface of said substrate, to prevent said copper deposited on said back surface of said substrate from diffusing into said silicon substrate.

15. The process of claim 14 wherein said chemical/mechanical processing is carried out for a period of time ranging from about 1 to about 4 minutes.

16. The process of claim 14 wherein said chemical/mechanical processing is carried out for a period of time sufficient to remove from about 1 to about 2 microns of silicon from said back surface of said substrate.

17. The process of claim 14 wherein said chemical/mechanical processing is carried out for a period of time sufficient to remove at least about 2 microns of silicon from said back surface of said substrate.

18. The process of claim 14 which further comprises repeating said chemical/mechanical polishing step to remove copper from said back surface of said substrate after each subsequent layer of copper interconnects is formed on said front surface of said silicon substrate.

19. In a process for forming an integrated circuit structure on a front surface of a silicon substrate wherein copper is deposited on said front surface of said substrate to form a layer of copper interconnects, and wherein at least some copper is also deposited on the back surface of the substrate during this deposition, the improvement which comprises:

chemically/mechanically polishing the roughened back surface of said substrate, after no more than two high temperature processing steps, to remove copper deposited thereon during said copper deposition on said front surface of said substrate, to prevent said copper deposited on said back surface of said substrate from diffusing into said silicon substrate.

20. In a process for forming an integrated circuit structure on a front surface of a silicon substrate wherein copper is deposited on said front surface of said substrate to form a layer of copper interconnects, and wherein at least some copper is also deposited on the back surface of the substrate during this deposition, the improvement which comprises:

a) chemically/mechanically polishing the roughened back surface of said substrate, prior to any further high temperature processing of said substrate, for a period of time ranging from about 1 to about 3 minutes, to remove copper deposited thereon during said copper deposition on said front surface of said substrate; and b) repeating said chemical/mechanical polishing step to remove copper from said back surface of said substrate after each subsequent layer of copper interconnects is formed on said front surface of said silicon substrate;

to prevent said copper deposited on said back surface of said substrate from diffusing into said silicon substrate.

* * * * *